United States Patent [19]
Soulard

[11] Patent Number: 5,469,336
[45] Date of Patent: Nov. 21, 1995

[54] NON-RADIATING ENCLOSURE INCLUDING A STACK OF CLOSURE PLATES HAVING SLATS STAGGERED ABOUT AN APERTURE IN A WALL OF THE ENCLOSURE

[75] Inventor: Roger R. Soulard, Dracut, Mass.

[73] Assignee: Wang Laboratories, Inc., Lowell, Mass.

[21] Appl. No.: 219,067

[22] Filed: Mar. 29, 1994

[51] Int. Cl.⁶ .............................. H05K 9/00; H02G 3/16; H01R 9/07
[52] U.S. Cl. .................... 361/818; 174/35 R; 174/35 C; 174/65 R; 361/816; 439/457; 439/458; 439/607; 439/610
[58] Field of Search .............................. 174/35 R, 35 C, 174/356 C, 357 S, 36, 65 R; 333/12, 238, 246, 247, 243, 244; 361/753, 800, 816, 817, 818; 439/456, 457, 458, 459, 607, 608, 610; 455/300, 301

[56] References Cited

U.S. PATENT DOCUMENTS

| 4,308,417 | 12/1981 | Martin | 361/818 |
| 5,329,066 | 7/1994 | Hansson | 439/608 |
| 5,353,202 | 10/1994 | Ansell et al. | 174/35 C |

FOREIGN PATENT DOCUMENTS

| 2247897 | 9/1972 | Germany | 174/35 R |
| 2315572 | 3/1973 | Germany | 174/35 R |
| 3335664 | 4/1985 | Germany | 174/35 R |
| 3500655 | 7/1986 | Germany | 174/65 R |
| 4-303998 | 10/1992 | Japan | 174/35 R |
| 5-335781 | 12/1993 | Japan | 174/35 R |
| 2190548 | 11/1987 | United Kingdom | 439/608 |
| 2212000 | 7/1989 | United Kingdom | 174/35 R |
| 2221100 | 1/1990 | United Kingdom | 174/35 R |

OTHER PUBLICATIONS

IBM Technical Disclosure Bulletin "Electromagnetic Shielded Connector" by A. D. Bunch et al. vol. 15 No. 1 Jun. 1972 (pp. 34 and 35).

IBM Technical Disclosure Bulletin "Access Hole Cover" by Clark et al. vol. 22 No. 2 Jul 1979 (pp. 717 and 718).

IBM Tech. Discl. Bul. "Connector Shield/Bracket to Provide Electromagnetic Compatibility" vol. 30 No. 6 Nov. 1987 (pp. 18 and 19).

Primary Examiner—Donald A. Sparks
Attorney, Agent, or Firm—Kenneth L. Milik

[57] ABSTRACT

A stack of closure plates with slots are slipped over a cable passing through an aperture in a wall of a radiation containment enclosure and affixed to the enclosure wall. The slots of the plates are staggered with alternate plates bearing on opposite side of the cable to secure the cable and impede leakage of radiation through the aperture and along the cable.

11 Claims, 2 Drawing Sheets

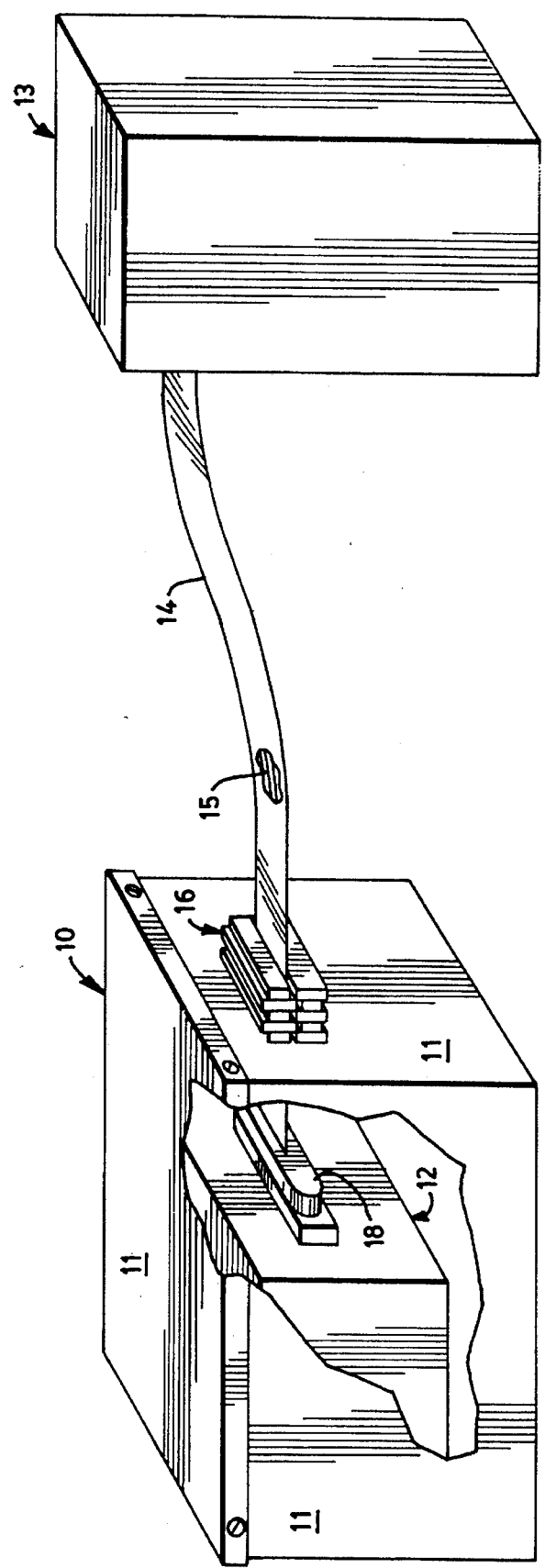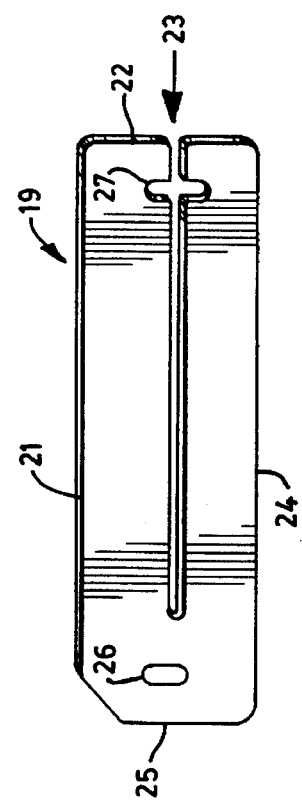

NON-RADIATING ENCLOSURE INCLUDING A STACK OF CLOSURE PLATES HAVING SLATS STAGGERED ABOUT AN APERTURE IN A WALL OF THE ENCLOSURE

BRIEF SUMMARY OF THE INVENTION

This invention relates to connecting to electrical apparatus within a radiation containing enclosure.

It is sometimes desired to reduce the broadcast of electromagnetic radiation from some piece of electrical apparatus. This may be accomplished by enclosing the radiating apparatus in a metal enclosure. Method and apparatus according to this invention provides for connecting apparatus so enclosed to apparatus outside the enclosure that is effective in avoiding radiation leaks and is inexpensive both as to materials and installation labor.

The invention features an aperture in an enclosure wall large enough to permit passage of a connector fitting on the end of a cable. After the connector fitting is passed through the aperture, a stack of closure plates with slots are slipped over the cable and affixed to the enclosure wall. The slots of the plates are staggered with alternate plates bearing on opposite side of the cable to secure the cable and impede leakage of radiation through the aperture and along the cable.

BRIEF DESCRIPTION OF THE DRAWING

FIG. 1 shows apparatus within an enclosure {part of the enclosure shown cut away} connected to apparatus outside the enclosure according to the invention.

FIG. 2 shows a closure plate used in the invention.

DETAILED DESCRIPTION

Figure 3:
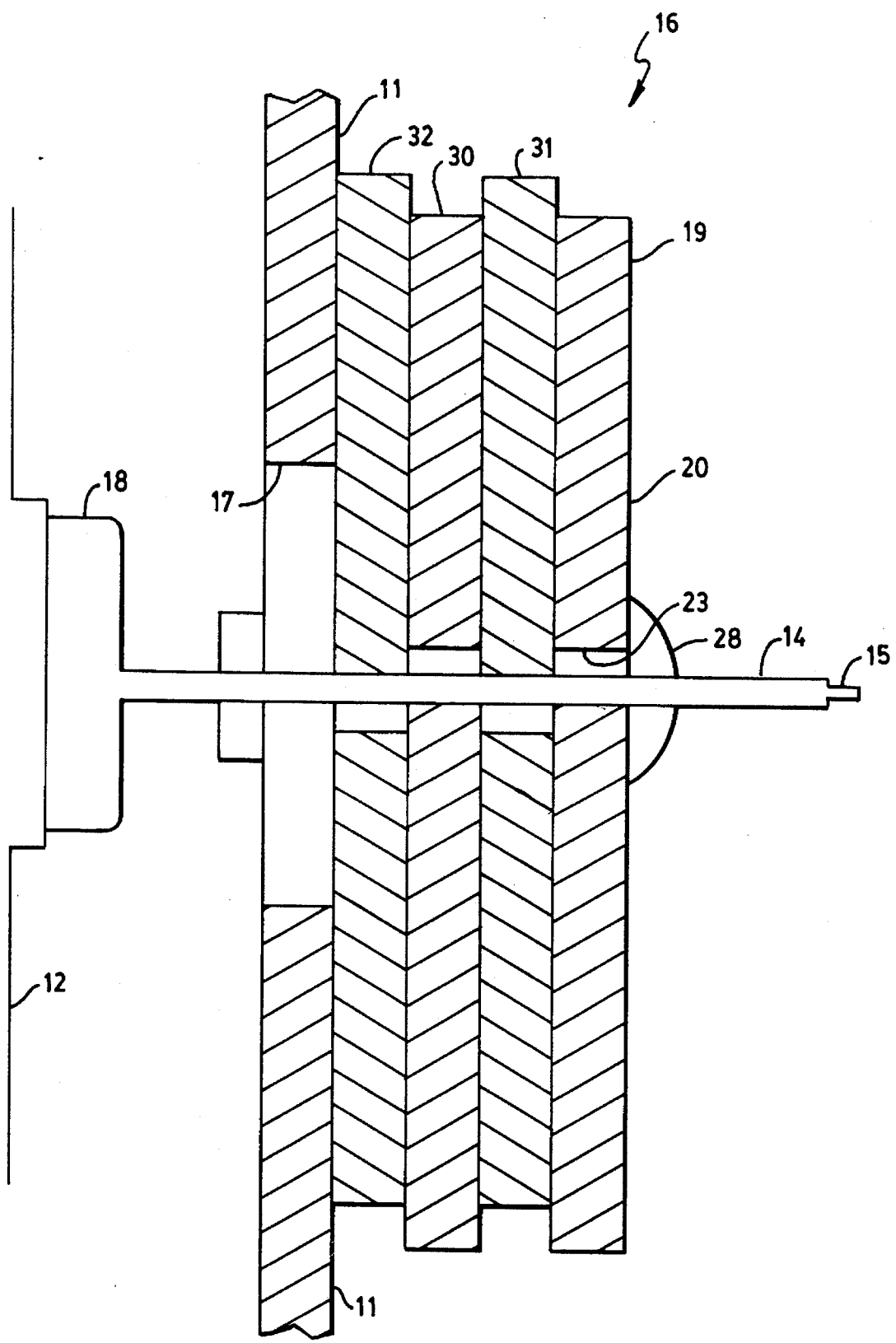
FIG. 3 shows in detail the structure of the enclosure of FIG. 1 in the vicinity of the place where a cable enters the enclosure.

The invention may be described with reference to the Figures.

Enclosure 10 has an enclosing wall 11 made of electrically conductive material which defines an interior and exterior space. Electrical apparatus which emits electromagnetic radiation, the broadcast of which is undesirable, is situated within enclosure 10. Another electrical apparatus 13 outside of enclosure 10 is connected by cable 14 to apparatus 12. Cable 14 has the form of a ribbon with parallel conductors 15 lying side by side and extending the length of the cable. Cable 14 runs into enclosure 10 through closure structure 16 and aperture 17 and is terminated in connector fitting 18, which is smaller than aperture 17.

Closure structure 16 includes a stack 20 of identical closure plates 19. As shown particularly in FIG. 2, each closure plate 19 is made from flat metal stock and has a generally rectangular shape with two longer edges 21, 24 and two shorter edges 22, 25. Slot 23 communicates with shorter edge 22, and is wider than ribbon cable 14, but not as wide as connector fitting 18. Slot 23 runs generally parallel to longer edges 21, 24, and is closer to edge 24 than to edge 21. Holes 26, 27 provide passageways for clamping devices.

The connecting of apparatus 12 to apparatus 13 is accomplished as follows. Cable 14 is connected at one of its ends to apparatus 13. The other end of cable 14 is terminated in connector fitting 18. Connector fitting 18 is then passed through aperture 17 into the interior of enclosure 10 and connected to a mating fitting of apparatus 12. Closure plates 19 are positioned in a stack covering aperture 17 with cable 14 in the slots of the closure plates, as shown particularly in FIG. 3.

The plates are arranged in the stack in a first and a second set with plates of the first and of the second set interleaved in the stack. As shown in FIG. 3, plates 19 and 30 are members of the first set, and plates 31 and 32 are members of the second set. Although all the plates are identical, those of the first set are differently oriented in the stack from those of the second set. In particular, the plates of the second set are rotated 180 deg around an axis perpendicular to the plates with respect to the plates of the first set. This means that the blind ends of the slots of the plates of the second set will be on opposite sides of the stack from those of the first set, and also that the longer edges that are closer to the slot of the second set of plates will be on the opposite side of the stack from the longer edges which are closer to the slot of the first set of plates.

The described arrangement of the plates in the stack produces the configuration shown in FIG. 3, where the edges of plates of the first set protrude beyond those of the second set at the bottom while the edges of the plates of the second set protrude at the top.

When the plates have been arranged as described, the stack is squeezed together by pressing on the protruding edges so that the plates of the first set bear against the bottom of cable 14, while the plates of the second set bear against the top of the cable. While the plates are so squeezed, the stack is affixed to wall 11 of enclosure 10 by some clamping device such as screws 28 passing through holes 26 and 27.

What is claimed is:

1. An enclosure with a wall made of electrically conductive material defining an interior space and an exterior space, there being first electrical apparatus in said interior space connected by a cable to second electrical apparatus in said exterior space, said wall having an aperture for passage of said cable therethrough, said enclosure including a closure structure comprising a stack of closure plates affixed to said wall and covering said aperture, each closure plate being made from flat metal stock and having a generally flat form and including a slot communicating with the periphery of the closure plate and sized to admit said cable, said closure plates being affixed to said wall in positions such that boundaries of the slots of a first set of plates bear on a first side of said cable and are spaced from a second side of said cable and boundaries of slots of a second set of said plates bear on said second side of said cable and are spaced from said first side of said cable.

2. An enclosure as claimed in claim 1, wherein:

said cable is terminated on one end with a connector fitting, said aperture is large enough to permit passing of said connector fitting therethrough, and said slots are not large enough to permit passing of said connector fitting therethrough, 3. An enclosure as claimed in claim 1, wherein said cable has the form of a ribbon with a plurality of conductors lying beside one another, said plates are of generally elongated form with two parallel edges, and said slot is wider than the thickness of said cable and runs parallel to said parallel edges.

4. An enclosure as claimed in claim 3, wherein said slot is closer to one of said parallel edges than to the other.

5. An enclosure as claimed in claim 4, wherein plates of said first set are interleaved with the plates of said second set in said stack, and plates of said first set have with respect to plates of said second set an orientation rotated by 180 degrees around an axis perpendicular to the plates.

6. A method for connecting a cable between apparatus within an enclosure having a wall made of electrically conductive material defining an interior space and an exterior space and apparatus exterior to said enclosure comprising the steps:

terminating said cable in a connector fitting, providing an aperture in said wall big enough for passage of said connector fitting therethrough, providing a plurality of closure plates, each closure plate made from flat metal stock, and including a slot communicating with the periphery of the closure plate and sized to admit said cable, passing said connect or fitting through said aperture, positioning said closure plates in a stack covering said aperture with said cable in said slots so that boundaries of slots of a first set of plates bear on a first side of said cable and are spaced from a second side of said cable and boundaries of slots of a second set of said plates bear on said second side of said cable and are spaced from said first side of said cable, affixing said plates when so positioned to said enclosure wall.

7. A method for electrically connecting between apparatus within a radiation containment enclosure and apparatus outside said enclosure, said enclosure having a wall made of electrically conductive material defining an interior space and an exterior space comprising the steps:

providing a cable with two ends, one of said ends being terminated in a connector fitting, providing an aperture in said wall big enough for passage therethrough of said connector fitting between the interior space and the exterior space, providing a plurality of closure plates, each closure plate made from flat metal stock, and including a slot communicating with the periphery of the closure plate and sized to admit said cable, passing said connector fitting through said aperture so that the ends of the cable are on different sides of said wall, connecting the ends of said cable respectively to said apparatuses, positioning, after said passing step is completed, said closure plates in a stack covering said aperture with said cable in said slots so that boundaries of slots of a first set of plates bear on a first side of said cable and are spaced from a second side of said cable and boundaries of slots of a second set of plates bear on said second side of said cable and are spaced from said first side of said cable, affixing said plates when so positioned to said enclosure wall.

8. A method as claimed in claim 7, wherein:

said cable has the form of a ribbon with a plurality of conductors lying beside one another, said plates are of generally elongated form with two parallel edges, and said slot is wider than the thickness of said cable and extends parallel to said parallel edges.

9. A method as claimed in claim 8, wherein said slot is closer to one of said parallel edges than to the other, 10. A method as claimed in claim 9, wherein plates of said first set are interleaved with the plates of said second set in a stack, and plates of said first set have with respect to plates of said second set an orientation rotated by 180 degrees around an axis perpendicular to the plates.

11. A method as claimed in claim 7, wherein said cable is terminated on one end with a connector fitting, said aperture is large enough to permit passing of said connector fitting therethrough, said slots are not large enough to permit passing of said connector fitting therethrough.

\* \* \* \* \*